United States Patent [19]

Kurihara et al.

[11] 4,394,626
[45] Jul. 19, 1983

[54] PHASE SYNCHRONIZING CIRCUIT

[75] Inventors: Hiroshi Kurihara, Tokyo; Sadao Takenaka, Yokohama; Eiji Itaya, Kamakura, all of Japan

[73] Assignee: Fujitsu Limited, Kawasaki, Japan

[21] Appl. No.: 211,847

[22] Filed: Dec. 1, 1980

[30] Foreign Application Priority Data

Nov. 29, 1979 [JP] Japan .................. 54-154554

[51] Int. Cl.³ .............................. H03L 7/08
[52] U.S. Cl. ............................ 331/12; 328/155; 331/22; 331/25; 375/118; 375/120
[58] Field of Search .................. 331/10–12, 331/17, 22, 25, 31; 329/122, 124; 375/118, 119, 120; 455/258, 260, 265; 328/155; 307/511, 512

[56] References Cited

U.S. PATENT DOCUMENTS 3,961,262  6/1976  Gassmann .............. 455/258 X
3,993,956  11/1976  Gilmore et al. ........... 375/118 X
4,314,206  2/1982  Attwood et al. .......... 331/12 X
4,318,049  3/1982  Mogensen .............. 329/122 X Primary Examiner—Siegfried H. Grimm
Attorney, Agent, or Firm—Staas & Halsey

[57] ABSTRACT

A phase synchronizing circuit, wherein two phase detectors are used in quadrature to detect the phase of an input signal and to avoid hang-up when the phase of the input signal changes abruptly by 180°. The two detected phase signals are then multiplied by a locally generated reference signal and re-combined, so that a synchronized output signal having reduced phase jitter results. This circuit is also incorporated in an N-phase PSK system, where it is used as a synchronizer and not as a demodulator. In a receiver for such a PSK system, the frequency of the received signal is multiplied by N, the phase synchronizer circuit of the invention is then used to extract the carrier (at a N times higher frequency), and a divider is then used to convert the synchronized carrier provided by the synchronizer circuit of the invention down to the original frequency.

14 Claims, 10 Drawing Figures

PHASE SYNCHRONIZING CIRCUIT

CROSS REFERENCE TO RELATED APPLICATION

Priority under 35 U.S.C. §119 is claimed for this application on the basis of Japanese Patent Application No. Tokugansho 54-154554, filed in Japan on Nov. 29, 1979.

BACKGROUND OF THE INVENTION

This invention relates to a phase synchronizing circuit which is configured similarly to a phase-locked loop (PLL), and is adapted to replace a PLL in many applications. A phase-locked loop circuit of the prior art is configured generally as shown in FIG. 1 of the drawings. A phase detector 10 provides an output signal indicative of the phase difference between the signal received at input 1 and the signal received from the voltage-controlled oscillator (VCO) 13, and this phase difference signal is filtered by low-pass filter 11, amplified by operational amplifier 12, and then applied to control the VCO. Operation of such circuits is described for example, in F. Gardner, *Phaselock Techniques* (second edition, 1979), which is hereby incorporated by reference.

However, this known circuit has the defect that, if the input phase (or frequency) undergoes a stepwise change, considerable time may be required until the phaselocked loop resumes tracking of the input signal. This difficulty is particularly acute when the phase change is close to 180°. This difficulty is known to those skilled in the art as the "hang-up effect", and may be found discussed generally in, for example, Gardner, Hang-up In Phase-Lock Loops, 25 IEEE Transactions on Communications 1210 (October 1977), which is hereby incorporated by reference. FIG. 2 of the drawings shows the delay in phase reacquisition, for various values $\phi$ of the phase error. As may be seen, when the phase error is very close to 180°, reacquisition may require a large number of cycles. The hang-up effect is a particularly unfortunate defect of the conventional phaselocked loops in synchronizer applications for digital communications. In such applications, particularly in phase-shift keying(PSK), the data modulation is likely to cause rapid phase shifts of the signal received, including apparent 180° phase shifts. Such apparent phase changes may also be caused by adjacent channel interference, or other defects of the transmission path. However, in many such applications, it is essential that the clock pulses generated within the receiver be in phase with the clock pulses generated at the transmitter (allowing for transmission path delay). Since decoding of the data often requires a clock (or a regenerated digital carrier pulse train) which is in synchrony with the information being received, the delay in phase reacquisition which may be imposed by the hang-up effect (as shown in FIG. 2) when the input signal shows a sudden apparent phase change of 180°, is unacceptable.

SUMMARY OF THE INVENTION

It is a principal object of this invention, therefore, to avoid the synchronization defect caused by the hang-up effect in conventional phase-locked loops, by providing a phase-locked loop circuit which immediately follows the phase of an input signal even when the input signal changes in an abrupt step-wise fashion.

Additional objects and advantages in the invention will be set forth in part in the description which follows, and in part will be obvious from the description, or may be learned by practice of the invention. The objects and advantages of the invention may be realized and attained by means of the instrumentalities and combinations particularly pointed out in the appended claims. To achieve the foregoing objects and in accordance with the purpose of the invention, as embodied and broadly described herein, the phase synchronizing circuit of the invention comprises:

an input terminal;

a voltage-controlled oscillator (VCO);

first and second phase detectors, each operatively connected to said input terminal and to said VCO;

first and second low-pass filters respectively connected to said first and second phase detectors;

first and second multipliers, respectively operatively connected to said first and second low-pass filters, each of said multipliers also being operatively connected to said VCO;

combining means, operatively connected to said first and second multipliers, for providing an output signal of a linear combination of the outputs of said respective multipliers;

an output terminal, connected to said output signal of said combining means; and at least one three-terminal phase shifting means, interposed along said connections among said VCO, phase detectors, filters, multipliers, and combining means, in such relation that said first and second phase detectors operate in an orthogonal relation with respect to an input signal received at said input terminal, and in such relation that said output signal of said combining means is synchronous with the signal received at said input terminal.

According to an embodiment of the present invention, the VCO may be controlled by the output of one of the two low-pass filters used.

According to another embodiment of the present invention, the VCO may be controlled by the outputs of both low-pass filters, multiplied together, with one of them being differentiated first.

BRIEF DESCRIPTION OF THE DRAWING

The accompanying drawings, which are incorporated herein and constitute part of the specification, illustrate various embodiments of this invention, and, together with the specification, serve to explain the principles of the invention.

Reference will now be made in detail to the presently preferred embodiments of the present invention, examples of which are illustrated in the accompanying drawings.

DESCRIPTION OF THE PREFERRED EMBODIMENTS

Figure 1:
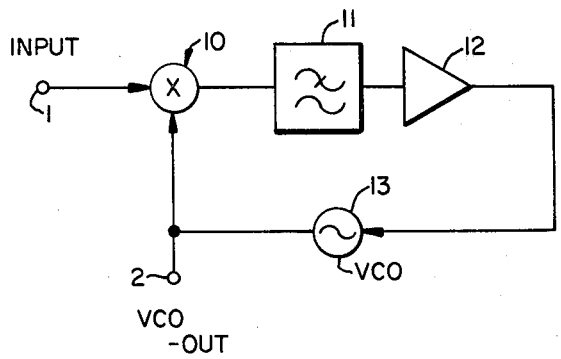
FIG. 1 shows a phase-locked loop circuit of the prior art, including a phase detector 10, low-pass filter 11, an operational amplifier 12, and a voltage-controlled oscillator (VCO) 13.
Figure 2:
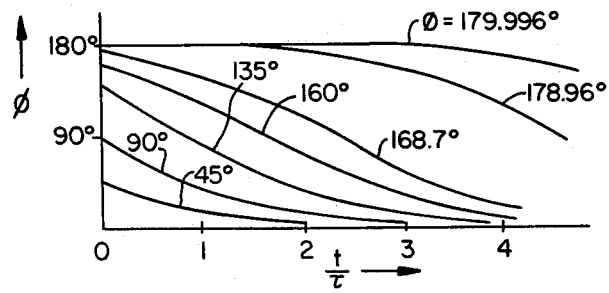
FIG. 2 is a graph showing acquisition time in cycles t/T versus initial phase error $\phi$, for a phase-locked loop circuit of the prior art such as that shown in FIG. 1, illustrative of the hang-up effect to which such prior art circuits are subject.
Figure 3:
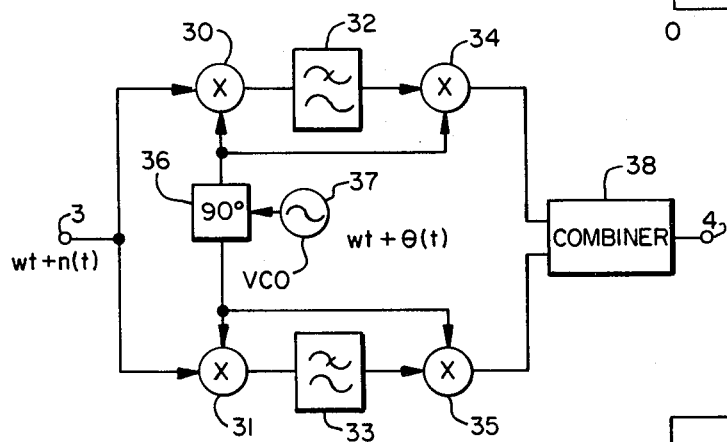
FIG. 3 shows a first embodiment of the present invention, in which a synchronized output is provided at the output terminal 4 synchronously with the signal received at the input terminal 3.

The preferred embodiments of this invention will now be explained in detail. FIG. 3 is a block diagram showing the basic principle of the invention. In this figure, an input terminal is indicated as 3; an output terminal as 4; phase detectors as 30 and 31; low-pass filters as 32 and 33; multipliers as 34 and 35; a 90° phase shifter as 36; and voltage-controlled oscillator (hereinafter referred to as VCO) as 37. A combiner (in this embodiment, an adder) is indicated as 38. An input signal received from the terminal 3 is represented as sin $[\omega t + n(t)]$, and the output of VCO 37 as cos $[\omega t + \theta(t)]$, where n(t) indicates phase variation due to the noise or data contained in the input signal. Thus, the expected time average of n(t) is 0. $\theta(t)$ is a function of the time when the frequencies of an input signal and VCO 37 are different from each other.

In the following discussion it will be assumed that the phase detectors 30 and 31 are phase detectors of the multiplier type. In practice, other types of phase detector could also be used. Using the above representations, the outputs of the phase detectors 30 and 31 become respectively as follows:

$$\sin[\omega t+n(t)] \cos[\omega t+\theta(t)] = \tfrac{1}{2} \sin[n(t)-\theta(t)] + \tfrac{1}{2} \sin[2\omega t+\theta(t)+n(t)] \quad (1)$$

$$\sin[\omega t+n(t)] \sin[\omega t+\theta(t)] = \tfrac{1}{2} \cos[n(t)-\theta(t)] - \tfrac{1}{2} \cos[2\omega t+\theta(t)+n(t)] \quad (2)$$

On the assumption that the low-pass filters 32 and 33 pass only the angular frequency components well below $2\omega$ and that their filtering has reduced the jitter component n(t) of the input signal down to n'(t), the outputs obtained respectively from filters 32 and 33 become as follows:

$$\sin[n'(t)-\theta(t)] \quad (3)$$

$$\cos[n'(t)-\theta(t)] \quad (4)$$

After multiplication of the respective two inputs of each of the multipliers 34 and 35, their resultant outputs are as follows:

$$\cos[\omega t+\theta(t)] \sin[n'(t)-\theta(t)] = \tfrac{1}{2}\sin[\omega t+n'(t)] - \tfrac{1}{2}\sin[\omega t-n'(t)+2\theta(t)] \quad (5)$$

$$\sin[\omega t+\theta(t)] \cos[n'(t)-\theta(t)] = \tfrac{1}{2}\sin[\omega t+n'(t)] + \tfrac{1}{2}\sin[\omega t-n'(t)+2\theta(t)] \quad (6)$$

At the output terminal 4, the outputs of multipliers 34 and 35 are added in the adder 38, and the following signal results:

$$\sin[\omega t+n'(t)] \quad (7)$$

In equation (7), the following results are visible:
1. Only an output which matches the input in frequency and phase can be obtained without alteration of the phase or frequency of the VCO 37.
2. Noise content (phase jitter) of the input signal is reduced by the pair of low-pass filters.

Therefore, pull-in (phase acquisition) by this invention is not delayed by the hang-up effect.

Figure 4:
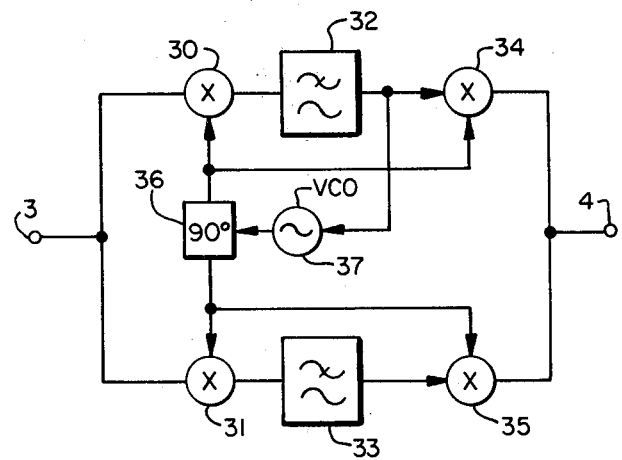
FIG. 4 shows a further embodiment of the present invention, which further incorporates means for frequency control of the VCO 37, in accordance with the output of one of the two low-pass filters provided in the circuit.

The frequency difference between an input signal and the VCO output must be well below the cut-off frequency of the low-pass filters 32 and 33, in order to attain result (7) above. If the frequency of a signal passing the low-pass filters approaches their stop-band, a phase deviation occurs in the output of the filters and directly appears in the output of the circuit shown in FIG. 3. This phenomenon, however, can be prevented by controlling the oscillation frequency of the VCO 37 with an output voltage of the low-pass filter 32, as indicated in FIG. 4. In this circuit, this control voltage must become very small in the steady state and therefore, in the symbolism of equation (3), $$\theta(t) \cong 0 \quad (8)$$

that is, the oscillation frequency of VCO 37 matches the input signal frequency.

Figure 5:
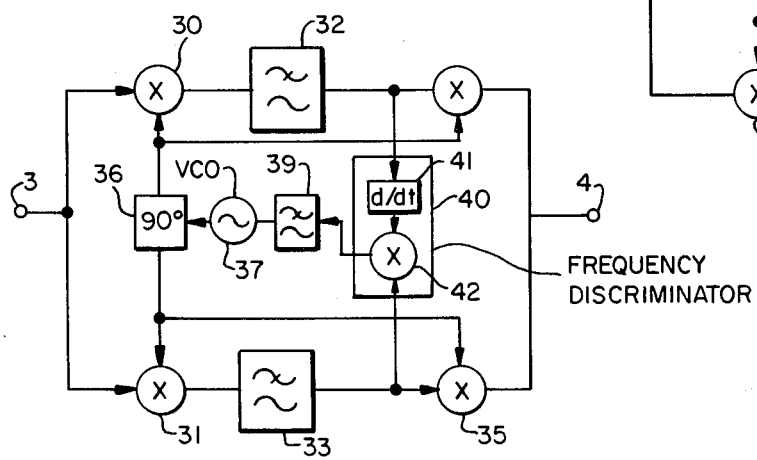
FIG. 5 shows yet another embodiment of the present invention, in which frequency control of the VCO 37 is provided in accordance with the filtered outputs of both phase detectors included in the circuit.

Moreover, as illustrated in FIG. 5, an output of the frequency discriminator 40 (which receives the outputs of the two low-pass filters 32 and 33) may be applied via the third low-pass filter 39 as the VCO control voltage. In other words, a frequency difference between an input signal and the reference signal of VCO is detected by the frequency discrimnator 40, and this detected difference controls the VCO 37 so that the frequency difference becomes zero. The frequency discriminator 40 is here shown composed, for example, of a differential circuit 41, which differentiates one input, and the multiplier 42 which multiplies the differentiated output with the other input.

The foregoing specific embodiment has been shown and described only for the purpose of illustrating the principles of this invention and is subject to change in the circuit configuration without departure from such principles.

Figure 6:
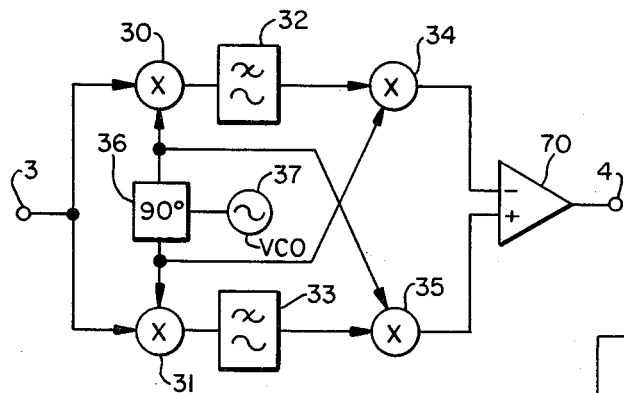
FIG. 6 shows a further embodiment of the present invention, in which the multiplier inputs are configured differently, so that a comparator 70 is used at the output terminal 4 in place of the adder 38 shown in FIG. 3.

FIG. 6 to FIG. 9 show examples of modifications of the embodiment described above. In the embodiment of FIG. 6, the inputs of multipliers 34 and 35 are interchanged. Therefore, the adder (combiner) 38 is replaced by the subtractor (combiner) 70, and the same result is obtained at the output terminal 4 through subtraction of the outputs of the multipliers 34 and 35.

Figure 7:
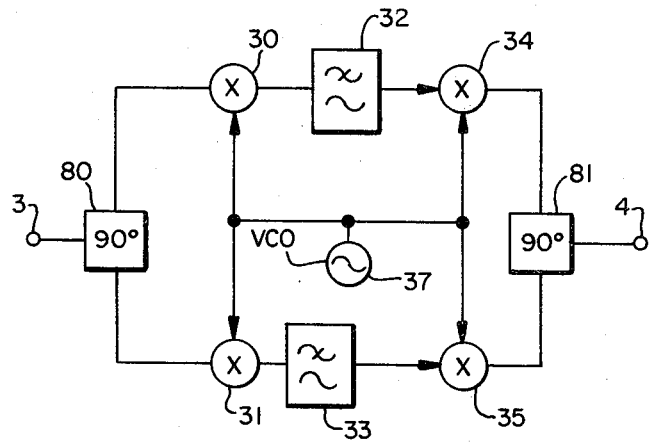
FIG. 7 shows yet another embodiment of the present invention, in which hybrid phase shifters 80 and 81 are provided at the input and output terminals, instead of at the VCO output as in FIG. 3.

FIG. 7 shows another modified embodiment where the in-phase oscillation frequencies are applied from the VCO 37 respectively to the phase detectors 30 and 31 and multipliers 34 and 35. Therefore, for the input signal, a 90° hybrid (network or transformer) 80 is provided as the 90° phase shifter, in order to shift the phase by 90° and send it respectively to the phase comparators 30 and 31, while for the output signal of the multipliers 34 and 35 a second 90° hybrid 81 is provided, in order to shift the phase by 90° and add them, respectively at the output terminal side. This modification of the first embodiment discussed also provides the same result at the output terminal 4.

Figure 8:
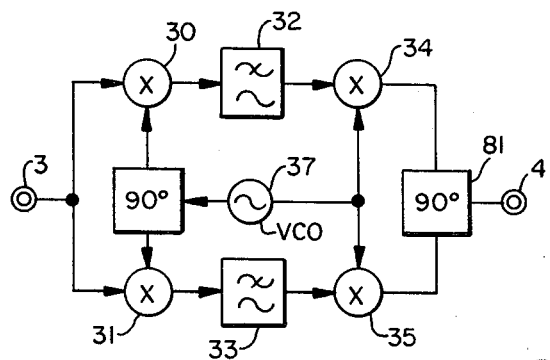
FIG. 8 shows yet another embodiment of the present invention, in which hybrid phase shifters are provided at the input to one of the phase detectors and at the output terminal, but not at either of the multipliers as in FIG. 3.

The embodiment of FIG. 8 shows a modification where the 90° hybrid 81 is provided only at the output terminal 4 side, and the output VCO 37 is applied in-phase to the multipliers 34 and 35.

Figure 9:
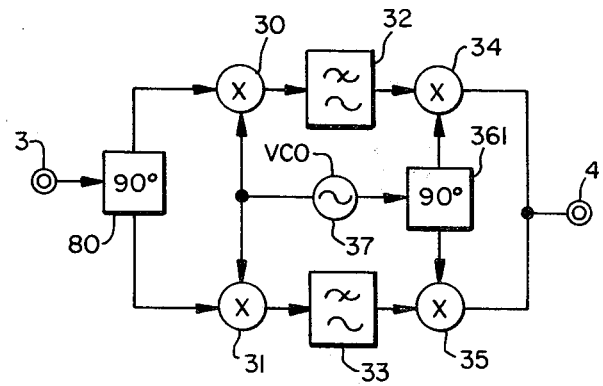
FIG. 9 shows still another embodiment of the present invention, in which phase shifters are provided at the input terminal, and at the input to the multipliers, but not at the input to the phase detectors.

In the further embodiment of FIG. 9, the outputs of VCO 37 are applied to the multipliers 34 and 35 after they are subject to phase shift of 90° by a 90° hybrid 361, while the in-phase outputs of VCO 37 are applied to the phase comparators 30 and 31. Therefore, the 90° hybrid 81 is not used.

Figure 10:
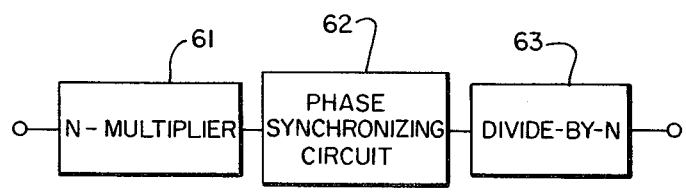
FIG. 10 is a block diagram showing application of the phase synchronizing circuit of the present invention in an N-phase phase-shift keying (PSK) system, wherein block 62 represents any of the phase synchronizing circuits according to the present invention.

FIG. 10 shows a preferred embodiment of the present invention wherein the above-described phase synchronizing circuit regenerates the carrier from an N-phase PSK modulated wave, where a frequency N-multiplier is indicated as 61. The unmodulated signal can be obtained by N-multiplication of the N-phase PSK modulated signal. The phase synchronizing circuit of this invention is indicated as 62, which can extract the N-multiplied carrier which is unmodulated by the aforementioned principle. Therefore, the circuit 63 is provided for dividing the N-multiplied carrier by N, in order to obtain the desired synchronizing carrier. In place of the N-multiplier shown as 61, the Nth harmonic of the carrier may also be regenerated by Nth order intermodulation among the side bands of the carrier, or by remodulation of the delayed carrier, using the data extracted by the conventional demodulation section of the receiver. The necessity for the phase synchronizing circuit of the invention arises here because the conventional demodulating circuit requires a reference signal which is synchronous with the transmission carrier, in order to correctly extract the information which is contained in the carrier as received. Further details regarding the operation and construction of such N-phase PSK systems may be found in Chapter 11 of the Gardner book, particularly at pages 222 to 230, and also in the following literature, all of which is hereby incorporated by reference: Ishio et al., "A New Multi-level Modulation And Demodulation System for Carrier Digital Transmission," in proceedings of the IEEE International Conference on Communications, June 1976, pages 29-7 to 29-12; Ramadam, "Practical Considerations in the Design of Minimum-Band Width, 90 MB, 8-PSK Digital Microwave System," in proceedings IEEE International Conference on Communications, June 1976, pp. 29-1 through 29-6.

In general, when a conventional PLL circuit is used as the phase synchronizing circuit in such a system, the PLL pull-in time becomes longer in the burst mode where the input signal becomes ON and OFF intermittently, but introduction of the present invention has solved such problems.

As described in detail above, the invention realizes a high speed pull-in, independent of the initial phase difference between the PLL circuit input and VCO. Thus, the present invention is particularly effective as the PLL circuit in the burst mode, for example, where the input signal is intermittent.

It will be apparent to those skilled in the art that various modifications and variations could be made in the phase synchronizing circuit of the present invention without departing from the scope or spirit of the invention. Thus, it is intended that the present invention cover the modifications and variations of this invention within the scope of the appended claims and their equivalents.

What is claimed is:

1. A phase synchronizing circuit comprising:
   an input terminal;
   a voltage-controlled oscillator (VCO) having an output and an input;
   first and second phase detectors, each operatively connected to said input terminal and to said output of said VCO;
   first and second low-pass filters, each of said filters having an input connected to a corresponding one of said first and second phase detectors, and an output, said first low-pass filter operatively connected to said input of said VCO, whereby the output of said first low-pass filter is applied to control the frequency of said VCO;
   first and second multipliers, respectively, operatively connected to said first and second low-pass filters, each of said multipliers also being operatively connected to said output of said VCO;
   adder means, operatively connected to said first and second multipliers, for providing an output signal of a linear combination of the outputs of said respective multipliers;
   an output terminal, connected to receive said output signal of said adder means; and
   at least one three-terminal phase shifting means, operatively connected between said first and second phase detectors and said VCO, and between said first and second multipliers and said VCO, in such relation that said first and second phase detectors operate in an orthogonal relation with respect to the input signal received at said input terminal, and in such relation that said output signal of said adder means is synchronous with the signal received at said input terminal.

2. A phase synchronizing circuit comprising:
   an input terminal;
   a voltage-controlled oscillator (VCO) having an output and an input;
   first and second phase detectors, each of said detectors operatively connected to said input terminal and to said output of said VCO;
   first and second low-pass filters, each of said filters having an input connected to a corresponding one of said first and second phase detectors, and an output;
   first and second multipliers, respectively, operatively connected to said first and second low-pass filters, each of said multipliers also being operatively connected to said output of said VCO;
   adder means, operatively connected to said first and second multipliers, for providing an output signal of a linear combination of the outputs of said respective multipliers;

an output terminal, connected to receive said output signal of said adder means; and at least one three-terminal phase shifting means, operatively connected between said first and second phase detectors and said VCO, and between said first and second multipliers and said VCO, in such relation that said first and second phase detectors operate in an orthogonal relation with respect to an input signal received at said input terminal, and in such relation that said output signal of said adder means is synchronous with the signal received at said input terminal;

a differentiator, operatively connected to the output of said first low-pass filter;

a third multiplier, operatively connected to the output of said differentiator and to the output of said second low-pass filter;

a third low-pass filter, operatively connected to said third multiplier, for filtering the output thereof, the output of said third low-pass filter being applied to said VCO to control the oscillation frequency of said VCO.

3. A phase synchronizing circuit comprising:
an input terminal;
a voltage controlled oscillator (VCO) having an output and an input;
first and second phase detectors, each of said detectors operatively connected to said input terminal and to said output of said VCO;
first and second low-pass filters each having an input conconnected to a corresponding one of said first and second phase detectors, and an output;
first and second multipliers, respectively, operatively connected to said first and second low-pass filters, each of said multipliers also being operatively connected to said output of said VCO;
subtractor means, operatively connected to said first and second multipliers, for providing an output signal of a linear combination of the outputs of said respective multipliers;
an output terminal, connected to receive said output signal of said subtractor means; and
three-terminal phase shifting means, operatively connected between said first and second phase detectors and said VCO, and between said first and second multipliers and said VCO, in such relation that said first and second phase detectors operate in an orthogonal relation with respect to an input signal received at said input terminal, and in such relation that said output signal of said subtractor means is synchronous with the signal received at said input terminal.

4. A phase synchronizing circuit comprising:
an input terminal;
a voltage-controlled oscillator (VCO) having an output and an input;
first and second phase detectors, each of said detectors operatively connected to said input terminal and to said output of said VCO;
first and second low-pass filters, each of said filters having an input connected to a corresponding one of said first and second phase detectors, and an outlet;
first and second multipliers, respectively, operatively connected to said first and second low-pass filters, each of said multipliers also being operatively connected to said output of said VCO;

adder means, operatively connected to said first and second multipliers, for providing an output signal of a linear combination of the outputs of said respective multipliers;
an output terminal, connected to receive said output signal of said adder means;
first phase shifting means interposed between said input terminal and said second phase detector; and
second phase shifting means interposed between said second multiplier and said output terminal,
wherein said first and second phase detectors operate in an orthogonal relation with respect to an input signal received at said input terminal, and in such relation that said output signal of said adder means is synchronous with the signal received at said input terminal.

5. The circuit of claim 4, wherein said first phase shifting means comprises a 90° hybrid circuit connected to said input terminal and to said first and second phase detectors.

6. The circuit of claim 5, wherein said second phase shifting means comprises a 90° hybrid circuit connected to said first and second multipliers and to said output terminal, and wherein said 90° hybrid circuit also comprises said adder.

7. A phase synchronizing circuit comprising:
an input terminal;
a voltage-controlled oscillator (VCO) having an output and an input;
first and second phase detectors, each of said detectors operatively connected to said input terminal and to said output of said VCO;
first and second low-pass filters, each of said filters having an input connected to a corresponding one of said first and second phase detectors, and an output;
first and second multipliers, respectively, operatively connected to said first and second low-pass filters, each of said multipliers also being operatively connected to said output of said VCO;
first phase shifting means interposed between said VCO and said second phase detector; and
second phase shifting means comprising a 90° hybrid circuit connected to said first and second multipliers, said 90° hydrid including
adder means for providing an output signal of a linear combination of the outputs of said respective multipliers;
an output terminal, connected to receive said output signal of said adder means and connected to said first and second multipliers, wherein
said first and second phase detectors operate in an orthogonal relation with respect to an input signal received at said input terminal, and in such relation that said output signal of said adder means is synchronous with the signal received at said input terminal.

8. A receiver for an N-phase shift keying system, comprising:
means for receiving a carrier;
means, operatively connected to said means for receiving said carrier, for multiplying the frequency of said carrier by N;
phase synchronizing means, connected to said multiplying means, for producing a synchronous signal in accordance with said carrier which has been multiplied by N; and
means, connected to said phase synchronizing means, for dividing the frequency of said synchronous signal produced by said phase synchronizing means by N;

wherein said phase synchronizing means comprises:

an input terminal;

a voltage-controlled oscillator (VCO) having an output;

first and second phase detectors, each of said detectors operatively connected to said input terminal and to said output of said VCO;

first and second low-pass filters respectively connected to said first and second phase detectors;

first and second multipliers, respectively operatively connected to said first and second low-pass filters, each of said multipliers also being operatively connected to said VCO;

combining means, operatively connected to said first and second multipliers, for providing an output signal of a linear combination of the outputs of said respective multipliers;

an output terminal, connected to receive said output signal of said combining means; and at least one three-terminal phase shifting means, interposed along said connections among said VCO, phase detectors, filters, multipliers, and combining means, in such relation that said first and second phase detectors operate in an orthogonal relation with respect to an input signal received at said input terminal, and in such relation that said output signal of said combining means is synchronous with the signal received at said input terminal;

said input terminal of said phase synchronizing means being connected to said multiplying means, and said output terminal of said phase synchronizing means being connected to said dividing means.

9. A phase synchronizing circuit comprising:

a voltage-controlled oscillator (VCO) having an output and an input;

a three-terminal phase shifting means, connected to said output of said VCO, for phase shifting the output of said VCO by 90°;

an input terminal for receiving signals;

first phase detector means, connected to said phase shifting means and to said input terminal, for detecting the phase difference between the output of said phase shifting means and the signal received at said input terminal;

a first low-pass filter having an output connected to said input of said VCO and having an input connected to said first phase detector, for low-pass filtering the output of said first phase detector;

a first multiplier, connected to said phase shifting means and to said output of said first low-pass filter, for multiplying the respective outputs of said phase shifting means and said first low-pass filter together;

second phase detector means, connected to said phase shifting means and to said input terminal, for detecting and outputting the phase difference between the respective outputs of said phase shifting means and from said input terminal;

a second low-pass filter having an output and having an input connected to said second phase detector, for low-pass filtering the output of said second phase detector;

a second multiplier, connected to said output of said second low-pass filter and to said phase-shifting means, for multiplying the respective outputs of said second low-pass filter and of said phase shifting means together;

an output terminal; and an adder, connected to said first and second multipliers and to said output terminal, for outputting at said output terminal the sum of the outputs of said first and second multipliers.

10. A phase synchronizing circuit comprising:

a voltage-controlled oscillator (VCO) having an output and an input;

a three-terminal phase shifting means, connected to said output of said VCO, for phase shifting the output of said VCO by 90°;

an input terminal for receiving signals;

first phase detector means, connected to said phase shifting means and to said input terminal, for detecting the phase difference between the output of said phase shifting means and the signal received at said input terminal;

a first low-pass filter having an output connected to said input of said VCO and having an input connected to said first phase detector, for low-pass filtering the output of said first phase detector;

a first multiplier, connected to said phase shifting means and to said output of said first low-pass filter, for multiplying the respective outputs of said phase shifting means and said first low-pass filter together;

second phase detector means, connected to said phase shifting means and to said input terminal, for detecting and outputting the phase difference between the respective outputs of said phase shifting means and from said input terminal;

a second low-pass filter having an output, and having an input connected to said second phase detector, for low-pass filtering the output of said second phase detector;

a second multiplier, connected to said output of said second low-pass filter and to said phase-shifting means, for multiplying the respective outputs of said second low-pass filter and of said phase shifting means together;

an output terminal;

an adder, connected to said first and second multipliers and to said output terminal, for outputting at said output terminal the sum of the outputs of said first and second multipliers;

a differentiator, operatively connected to said output of said first low-pass filter;

a third multiplier, operatively connected to said output of said second low-pass filter and to said differentiator; and a third low-pass filter having an input operatively connected to said third multiplier and an output connected to said input of said VCO to control the oscillation frequency of said VCO.

11. A phase synchronizing circuit comprising:

a voltage-controlled oscillator (VCO) having an output and an input;

three-terminal phase shifting means, connected to said output of said VCO, for phase shifting the output of said VCO by 90°;

an input terminal for receiving signals;

first phase detector means, connected to said phase shifting means and to said input terminal, for detecting the phase difference between the output of said phase shifting means and the signal received at said input terminal;

a first low-pass filter having an output, and an input connected to said first phase detector, for low-pass filtering the output of said first phase detector;

a first multiplier, connected to said phase shifting means and to said output of said first low-pass filter, for multiplying the respective outputs of said phase shifting means and said first low-pass filter together;

second phase detector means, connected to said phase shifting means and to said input terminal, for detecting and outputting the phase difference between the respective signals received from said phase shifting means and from said input terminal;

a second low-pass filter having an output and an input connected to said second phase detector, for low-pass filtering the output of said second phase detector, a second multiplier, connected to said output of said second low-pass filter and to said phase shifting means, for multiplying the respective outputs of said second low-pass filter and of said phase shifting means together;

an output terminal; and a subtractor, connected to said first and second multipliers and to said output terminal, for outputting at said output terminal the difference of the outputs of said first and second multipliers.

12. A phase synchronizing circuit, comprising:

a voltage-controlled oscillator (VCO);

an input terminal for receiving signals;

first hybrid circuit means, connected to said input terminal, for providing two outputs which are separated in phase by 90°;

first phase detector means, connected to said VCO and to a first one of said outputs of said first hybrid circuit means, for detecting the phase difference between the output of said VCO and said first output of said first hybrid circuit means;

a first low-pass filter, connected to said first phase detector, for low-pass filtering the output of said first phase detector;

a first multiplier, connected to said VCO and to said first low-pass filter, for multiplying the respective outputs of said VCO and of said first low-pass filter together;

second phase detector means, connected to said VCO and to the other one of said outputs of said first hybrid circuit means, for detecting and outputting the phase difference between the respective signals received from said VCO and from said first hybrid circuit means;

a second low-pass filter, connected to said second phase detector, for low-pass filtering the output of said second phase detector;

a second multiplier, connected to said second low-pass filter and to said VCO, for multiplying the respective outputs of said second low-pass filter and of said VCO together;

an output terminal; and second hybrid circuit means, connected to said multipliers and to said output terminal, for altering the phase of the output of one of said multipliers by 90° and adding said altered phase output together with the output of the other one of said multipliers, and for outputting the sum thereof at said output terminal.

13. A phase synchronizing circuit comprising:

a voltage-controlled oscillator (VCO) having an output and an input;

a three-terminal phase shifting means, connected to said output of said VCO, for phase shifting the output of said VCO by 90°;

an input terminal for receiving signals;

first phase detector means, connected to said phase shifting means and to said input terminal, for detecting the phase difference between the output of said phase shifting means and the signal received at said input terminal;

a first low-pass filter having an output, and an input connected to said first phase detector, for low-pass filtering the output of said first phase detector;

a first multiplier, connected to said output of said VCO and to said output of said first low-pass filter, for multiplying the respective outputs of said VCO and said first low-pass filter together;

second phase detector means, connected to said phase shifting means and to said input terminal, for detecting and outputting the phase difference between the outputs of said phase shifting means and the signal received at said input terminal;

a second low-pass filter having an output and an input connected to said second phase detector, for low-pass filtering the output of said second phase detector;

a second multiplier, connected to said output of said second low-pass filter and to said output of said VCO, for multiplying the respective outputs of said second low-pass filter and of said VCO together;

an output terminal; and hybrid circuit means, connected to said multipliers and to said output terminal, for altering the phase of the output of one of said multipliers by 90° and adding said altered phase output together with the output of the other one of said multipliers, and for outputting the sum thereof at said output terminal.

14. A phase synchronizing circuit, comprising:

a voltage-controlled oscillator (VCO);

an input terminal for receiving signals;

first hybrid circuit means, connected to said input terminal, for providing two outputs which are separated in phase by 90°;

first phase detector means, connected to said VCO and to a first one of said outputs of said first hybrid circuit means, for detecting the phase difference between the output of said VCO and said first output of said first hybrid circuit means;

a first low-pass filter, connected to said first phase detector, for low-pass filtering the output of said first phase detector;

second hybrid circuit means, connected to said VCO, for providing two outputs at the frequency of the output of said VCO which are separated in phase by 90°;

a first multiplier, connected to said second hybrid circuit means and to said first low-pass filter, for multiplying a first one of said outputs of said second hybrid circuit with the output of said first low-pass filter;

second phase detector means, connected to said VCO and to the other one of said outputs of said first hybrid circuit means, for detecting and outputting the phase difference between the respective signals received from said VCO and from said first hybrid circuit means;

a second low-pass filter, connected to said second phase detector, for low-pass filtering the output of said second phase detector;

a second multiplier, connected to said second low-pass filter and to said second hybrid circuit means, for multiplying the other one of said outputs of said second hybrid circuit means with the output of said second low-pass filter; and an output output terminal, connected to the outputs of both said multipliers.

* * * * *